(12) United States Patent
Searfoss

(10) Patent No.: US 7,246,838 B2
(45) Date of Patent: Jul. 24, 2007

(54) TRAILER COVER SYSTEM

(75) Inventor: Timothy K. Searfoss, Alger, MI (US)

(73) Assignee: Roll-Rite, LLC, Alger, MI (US)

( * ) Notice: Subject to any disclaimer, the term of this patent is extended or adjusted under 35 U.S.C. 154(b) by 0 days.

(21) Appl. No.: 11/261,899

(22) Filed: Oct. 28, 2005

(65) Prior Publication Data
US 2006/0049657 A1 Mar. 9, 2006

Related U.S. Application Data

(63) Continuation of application No. 10/852,514, filed on May 24, 2004, now abandoned, and a continuation of application No. 10/665,806, filed on Sep. 19, 2003, now Pat. No. 6,861,711.

(51) Int. Cl.
B60P 7/02 (2006.01)

(52) U.S. Cl. ................................. 296/100.01

(58) Field of Classification Search ............ 296/100.01
See application file for complete search history.

(56) References Cited

U.S. PATENT DOCUMENTS 4,234,224 A * 11/1980 Rosenvold .................... 296/98
6,318,790 B1 * 11/2001 Henning ....................... 296/98

* cited by examiner

Primary Examiner—H Gutman
(74) Attorney, Agent, or Firm—Larson Newman Abel Polansky & White, LLP

(57) ABSTRACT

A wall section is disclosed for a trailer. The wall section comprises a male end and a female end. The male end includes a central recess having at least one protrusion on each side of the central recess, the protrusions defining respective lateral recesses. The female end includes a central protrusion having at least one lateral protrusion on each side of the central protrusion, the central protrusion and the lateral protrusions defining respective recesses.

17 Claims, 6 Drawing Sheets

TRAILER COVER SYSTEM

PRIORITY CLAIM

This application is a continuation of U.S. patent application Ser. No. 10/665,806, filed Sep. 19, 2003, now U.S. Pat. No. 6,861,711, the entirety of which is hereby incorporated by reference. This application is also a continuation of U.S. patent application Ser. No. 10/852,514, filed May 24, 2004, now abandoned.

TECHNICAL FIELD

This invention relates to covers for truck trailers, and more particularly to a trailer cover system.

BACKGROUND ART

Many truck trailers, particularly those hauling loose loads such as sand and gravel, need a cover to prevent the wind from blowing load particles off the load bed. Various apparatus have been devised for covering a trailer load. Some such apparatus include a motor for selectively winding a flexible cover. An effective cover should be one which is easily operated by the truck driver so as to selectively cover and uncover the load from the convenient location of the truck cab. My U.S. Pat. No. 5,031,955, the disclosure of which is hereby incorporated by reference, provides a truck cover which may be conveniently motor operated from the cab of a truck to extend the cover from a winding assembly proximate the front of the truck bed and toward the rear of the truck bed.

A need also exists for systems that cover the trailer from side to side. For instance, U.S. Pat. No. 5,328,228 shows a cover for truck bed and cargo. Similarly, U.S. Pat. No. 5,924,758 shows a roll assist mechanism for tarp systems. My U.S. Pat. Nos. 6,206,449 and 6,527,331, the disclosures of which are also hereby incorporated by reference, show a side-to-side truck cover system including a pair of arms, each of which includes a base and an extension.

DISCLOSURE OF INVENTION

One aspect of the present invention is a wall section for a trailer. The wall section comprises a male end and a female end. The male end includes a central recess having at least one protrusion on each side of the central recess, the protrusions defining respective lateral recesses. The female end includes a central protrusion having at least one lateral protrusion on each side of the central protrusion, the central protrusion and the lateral protrusions defining respective recesses.

Accordingly, an object of this invention is to provide an apparatus of the type described above for use on a trailer.

Another object of this invention is to provide an apparatus of the type described above for use in connection with covering the trailer.

Still another object of this invention is to provide an apparatus of the type described above for use in a system that provides selective, powered control over covering and uncovering the trailer.

Still another object of this invention is to provide an apparatus of the type described above that utilizes a relatively reduced number of small components.

Still another object of this invention is to provide an apparatus of the type described above that minimizes damage done to the apparatus during loading operations.

These and other objects, features, and advantages of the present invention are readily apparent from the following detailed description of the best mode for carrying out the invention when taken in conjunction with the accompanying drawings.

BEST MODE FOR CARRYING OUT THE INVENTION

Figure 1:
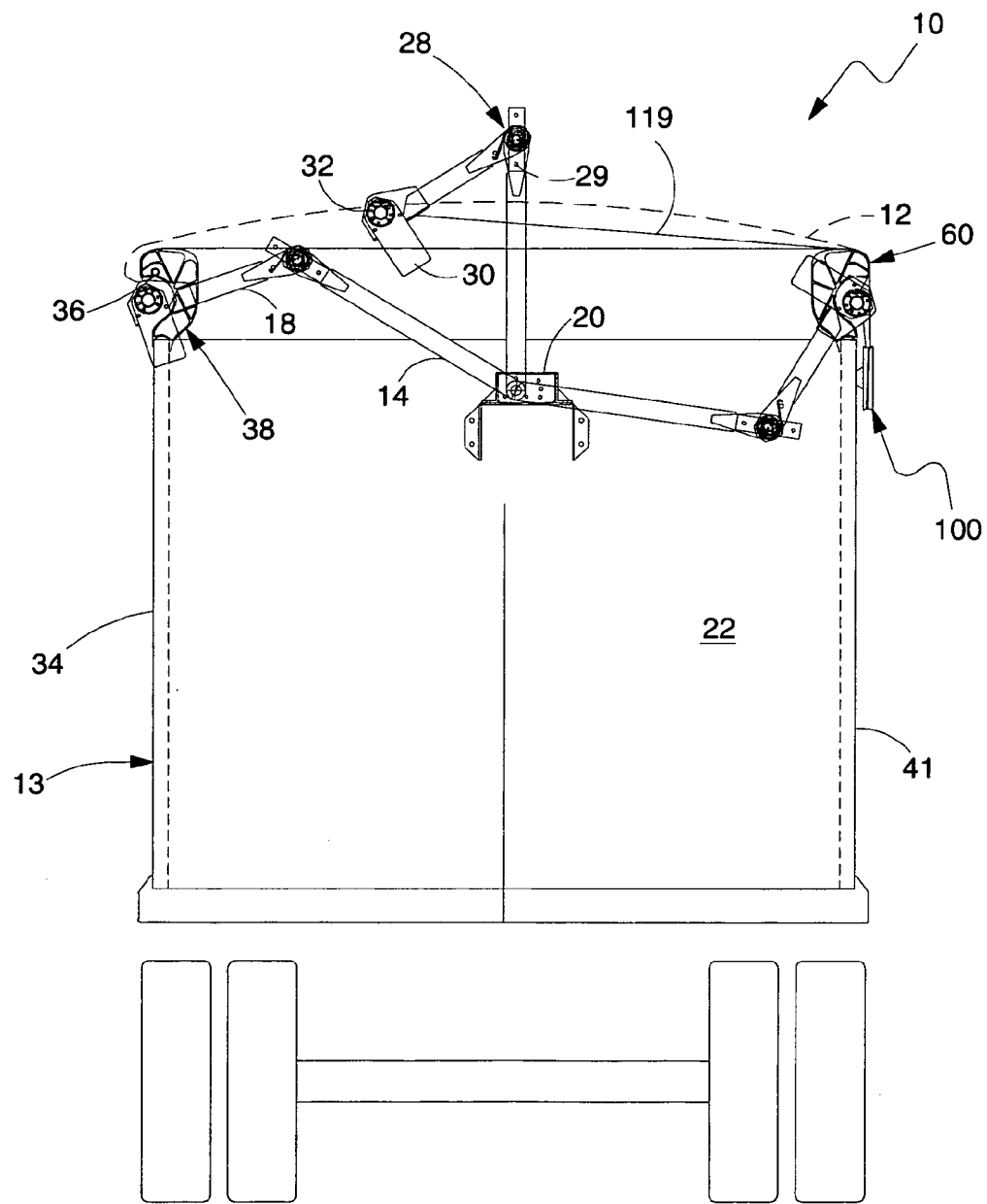
FIG. 1 is a front schematic view of a trailer including an apparatus according to the present invention for covering the trailer.
Figure 2:
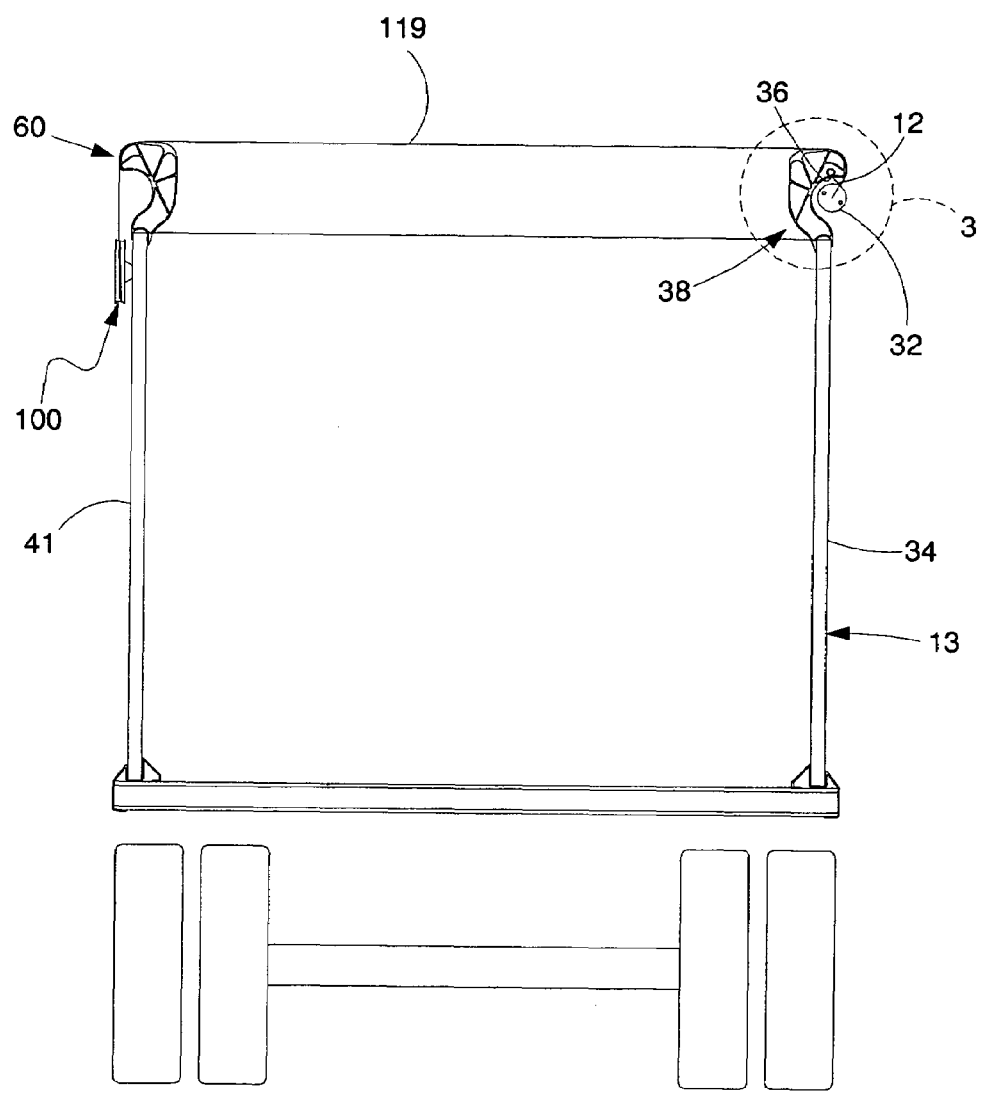
FIG. 2 is a rear schematic view of the trailer shown in FIG. 1.

With reference to the drawings, the preferred embodiments of the present invention will be described. FIGS. 1 and 2 show an arm assembly 10 for a flexible tarp or cover 12 of a truck trailer 13. The arm assembly 10 comprises a base 14 and an extension 18. The base 14 is preferably mounted to the trailer at a base plate 20 proximate the top of the front 22 of the trailer. While the base plate 20 is shown in the drawings centered and closer to the top of the trailer 13, it should be appreciated that the base plate may be mounted at a variety of locations.

The base plate 20 includes at least one spiral torsion spring. Preferably, one end of each of the springs engages a groove formed in the surface of and extending a substantial portion of the length of a center shaft, while the other ends of the springs cooperate with a locator pin. Further details of this arrangement are taught by U.S. Pat. No. 5,887,937, which is hereby incorporated by reference. In this way, the base 14 is normally biased clockwise as shown in FIG. 1 across at least a portion of the front 22 of the trailer from a mostly or fully uncovered, stowed position, through intermediate positions (only one of which is shown) and toward a deployed position.

The extension 18 is pivotally connected at one of its ends to the base 14 by a hinge or knuckle 28. Preferably, a knuckle shaft is welded or otherwise fixed to one of a pair of plates extending from an upper end of the base 14. The knuckle shaft extends through the lower end of the extension 18 such that the knuckle shaft is rotatable with respect to the extension. One end of each of a plurality of spiral torsion springs preferably engages an axial groove formed in the knuckle shaft. The other ends of the springs cooperate with a knuckle locator pin. Further details of this arrangement are taught by U.S. Pat. No. 5,944,374, which is hereby incorporated by reference.

In this way, the extension 18 is also normally biased clockwise as shown in FIG. 1. Rotation of the extension 18 in both directions may be limited by one or more stops which are preferably in the form of plates 29. The plates 29 are welded or otherwise attached to the knuckle 28, and extend inwardly therefrom to engage the extension and prevent overrotation. Another stop may be welded or otherwise attached to the front 22 of the trailer to limit the pivotal movement of the base 14, as taught by U.S. patent application Ser. No. 09/957,202 filed Sep. 20, 2001, the disclosure of which is hereby incorporated by reference.

Figure 3:
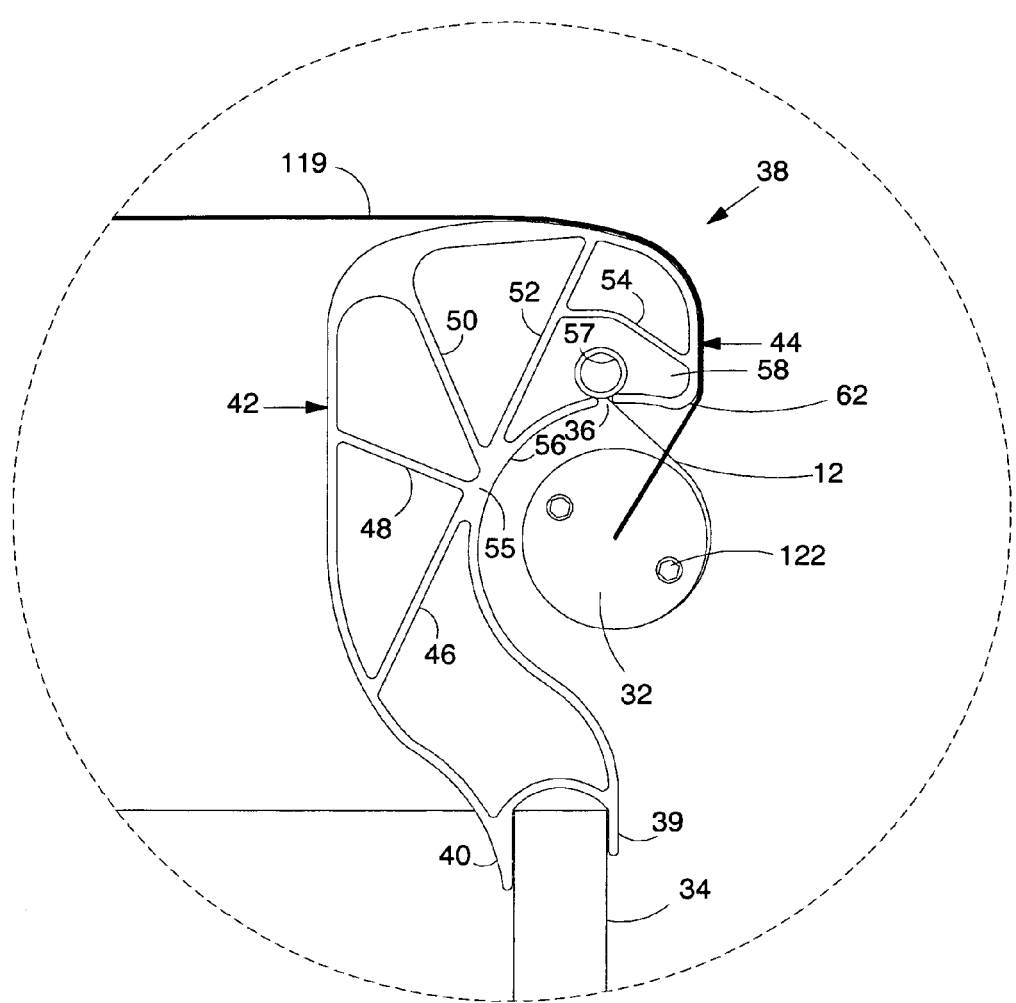
FIG. 3 is an enlarged view of a top rail shown in the portion of FIG. 2 designated "3"
Figure 4:
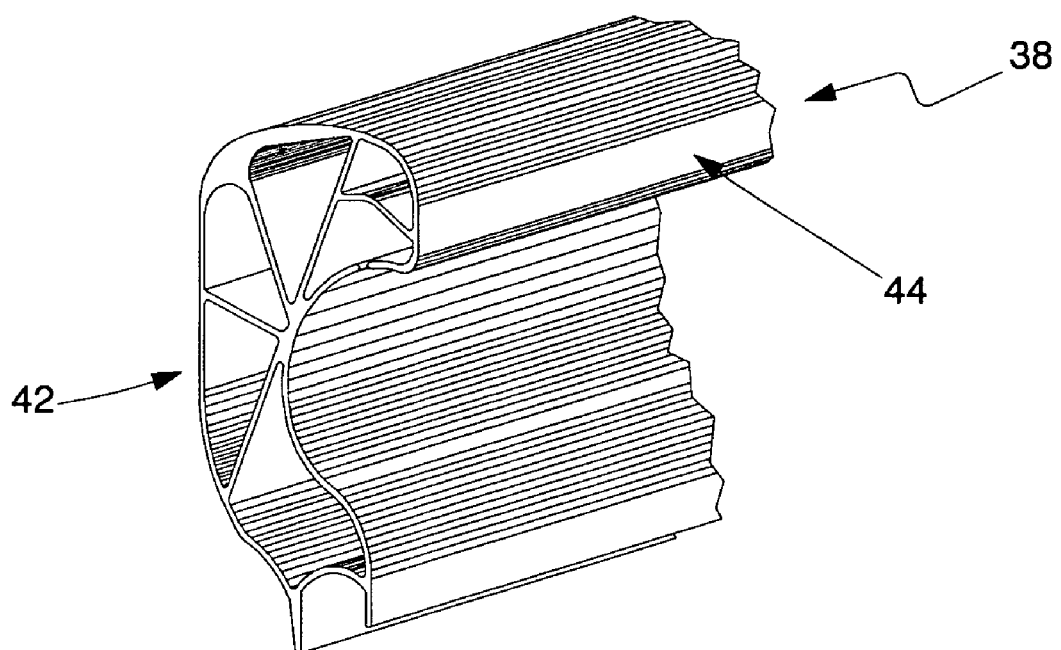
FIG. 4 is a perspective view of the top rail.

A motor 30 is mounted on the distal end of the extension 18. A rotatable reel 32 extends from the motor 30, and is operatively connected to one end of the cover 12 so as to function as a take-up spool. The other end of the cover 12 is clamped, riveted, or otherwise fixed at one or more points along a line below the top of one side 34 of the trailer, such as at one or more openings 36 along a top rail 38. As shown in FIGS. 3 and 4, the top rail 38 includes one or more metal or plastic pieces, such as extruded or pultruded aluminum or composite fiberglass polymer. The top rail 38, and an opposite top rail 60, include generally depending legs 39 and 40 that are adapted to be mounted over the top of the trailer wall 34 or the opposite trailer wall 41. The legs 39 and 40 may be fixed to the trailer walls in any conventional manner, such as by welding, riveting or bolting. The trailer may also be provided with front and rear end caps, which are not shown, in order to provide a uniform wall height around the perimeter of the trailer, if the front and rear walls of the trailer are not already high enough.

The top rails 38 and 60 also each include a major interior surface 42, a major exterior surface 44, and one or more ribs 46, 48, 50, 52 and 54 extending from one or both of the surfaces 42 and 44. In a preferred embodiment shown in the figures, the ribs 46, 48, 50 and 52 all meet at a reinforced section 55 proximate the exterior surface 44. A locking channel portion 56 of the exterior surface 44 is concave, in order to accommodate the stowed tarp spool 32 as shown in FIGS. 1 and 2. The concave portion 56 of the top rail 38 includes the opening 36, into which the stationary end of the tarp 12 may be anchored in any well known fashion. In a preferred embodiment, the tarp 12 is attached to the top rail 38 by sliding a tube 57 through a pocket in the stationary end of the tarp, and then sliding the stationary end of the tarp and the tube through a void 58 in the top rail with the tarp extending through the opening 36. The top rail 60, of course, does not require an opening similar to the opening 36.

For either of the top rails 38 or 60, the exterior surface 44 preferably includes a rounded lip 62 that extends to a point at or below the uppermost extent of the concave surface 56. In the fully uncovered position, the cover 12 is wound on the reel 32 until the reel resides generally proximate the concave surface 56. In this position, the trailer may dump rearwardly or in either the clockwise or counterclockwise direction without interference from the retracted cover.

The motor 30 is preferably provided with a brake which allows, among other things, for the apparatus 10 to remain in the stowed position. The lip 62 facilitates retention of the reel 32 in the stowed position. When the brake is released, the base 14 swings toward the driver's side 41 of the trailer, and the springs of the knuckle 28 also bias the extension 18 clockwise as shown in FIG. 1 toward the side 41 of the trailer so as to hold the cover 12 in tension. The motor 30 may be powered, from within or without the cab of the truck, to facilitate this operation. Further details of one embodiment of the motor are taught by U.S. Pat. No. 5,829,819, which is hereby incorporated by reference. In this way, the cover 12 is pulled off of the reel 32 and extended over the trailer. The motor 30 can be reversed to drive the reel 32 and retract the cover 12 against the tension force of the springs to uncover the load bed.

The top rail 60 is provided with a profile generally similar to the profile of the top rail 38 so that the motor 30 drives the reel 32 within the concave portion of the top rail 60, where the lip of the top rail 60 and the motor braking function may be used to hold the cover 12 in the deployed position. The top rails 38 and 60 thus allow the tarp reel 32 to reside close to the sides of the trailer in both the opened and closed positions. Because the tarp reel does not rest on the top of the trailer when the tarp is opened or closed, the overall height of the trailer and the possibility of a loader causing harm to the tarp assembly are reduced.

Any rotation of the base 14 less than about 250 degrees is contemplated, and in a preferred embodiment the base sweeps out an arc of about 120 degrees. Any rotation of the extension 18 relative to the base 14 is also contemplated, and in a preferred embodiment the extension rotates a total of about 250 degrees. By varying the position of the locator pins, the preload of the springs, the number of springs and/or the spring constant of the springs, the forces biasing the base and the extension toward the deployed position are variable. In a preferred embodiment, eight springs are used to bias the base 14, and three springs are used in the knuckle 28 between the base and the extension 18. In this arrangement the knuckle 28 opens relatively quickly, thus accommodating the weight of the axle, cover, and motor 30, and allowing the motor to swing from either its fully covered or uncovered place and clear the top rail 38 or 60.

Figure 5:
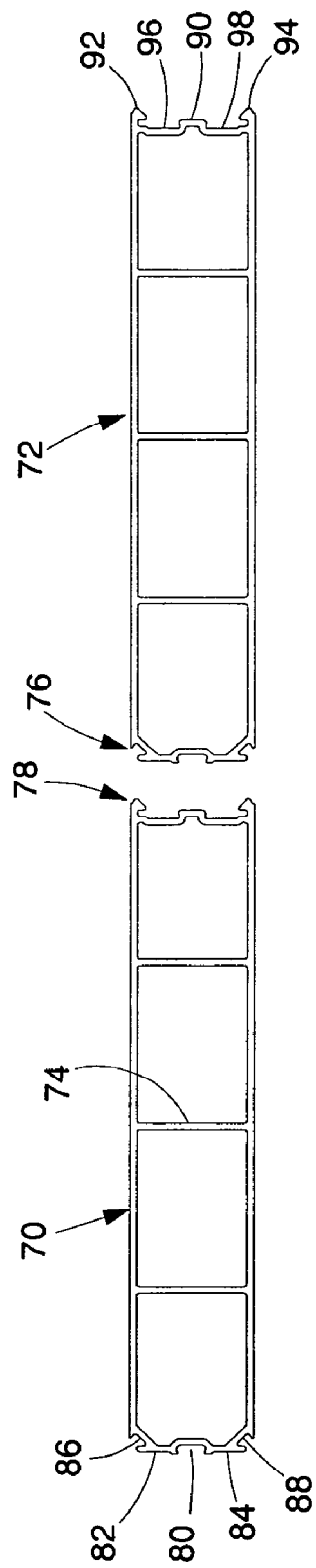
FIG. 5 is a cross-sectional view of interlocking sections of one embodiment of a wall of the trailer.
Figure 6:
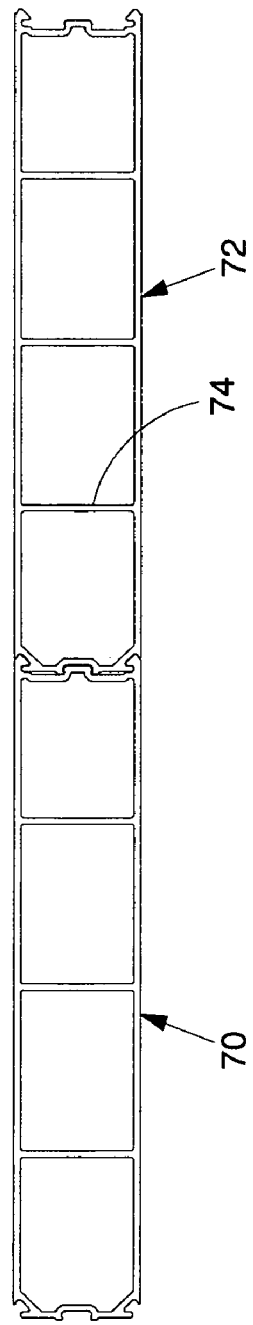
FIG. 6 is a cross-sectional view of the wall sections joined together.

FIGS. 5 and 6 show interlocking sections 70 and 72 that may be used to form the walls 34 and 41 of the trailer. The sections 70 and 72 are generally identical, and of course two or more may be needed to form the extent of a trailer wall, depending upon the length of the sections and the length of the wall required. The sections 70 and 72 have substantially smooth inner and outer sides joined by cross ribs 74. Each wall section includes a male end 76 and a female end 78. The male end 76 of one wall section is adapted to interlock with the female end 78 of an adjacent wall section. In a preferred embodiment, the male ends 76 include a central recess 80 flanked by protrusions 82 and 84. The protrusions 82 and 84 in turn define respective lateral recesses 86 and 88 generally proximate the outer surfaces of the wall sections. The female ends 78 include a central protrusion 90 flanked by lateral protrusions 92 and 94 generally proximate the outer surfaces of the wall sections. The central protrusion 90 and the lateral protrusions 92 and 94 in turn define respective recesses 96 and 98.

When brought together, the lateral protrusions 92 and 94 lockingly engage the lateral recesses 86 and 88, respectively. At the same time, the protrusions 82 and 84 lockingly engage the recesses 96 and 98, while the central protrusion 90 fits within the central recess 80. The sections 70 and 72 are preferably extruded from aluminum. After the wall sections are preassembled, with or without the top rails, the entire preassembly may be joined, such as by welding, to the metal rails of the truck bed. Because the individual wall sections do not need to be welded together, substantial time and effort may be avoided.

Figure 7:
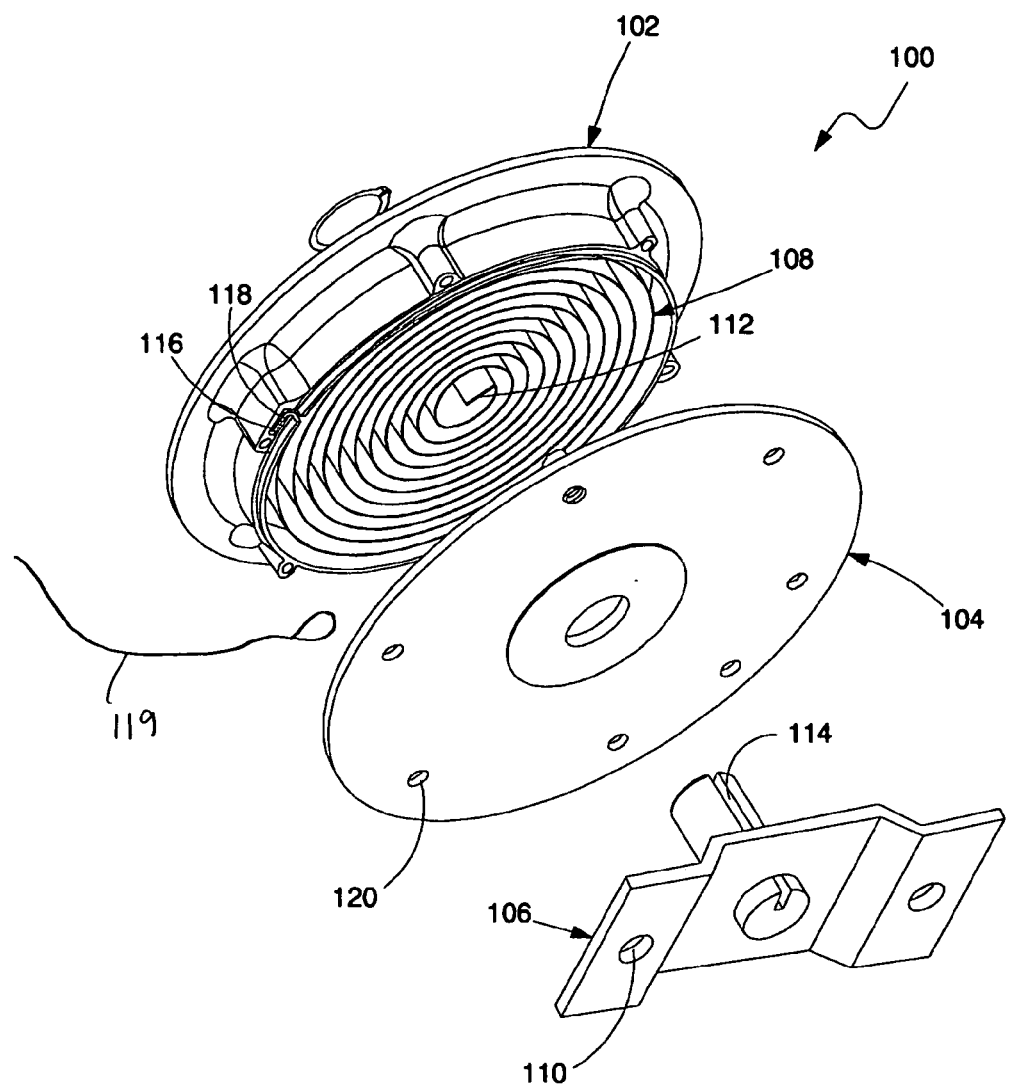
FIG. 7 is a perspective view of a cover return unit.

Referring again to FIG. 2, an elastic cord may be provided proximate the rear of the trailer for biasing the reel 32 toward the driver's side 41 of the trailer. More preferably, a cover return unit 100 is provided. The cover return unit 100 is preferably mounted on the driver's side 41 of the trailer, at or near the rear of the trailer. As shown in FIG. 7, the cover return unit 100 preferably includes two halves 102 and 104 molded in an automotive grade plastic and rotatably mounted on an external pivot pin assembly 106, and a large coil spring 108 contained inside the halves 102 and 104. The pivot pin assembly 106 is secured to the trailer, preferably by bolts extending through holes 110. One end 112 of the spring 108 is secured in a groove 114 in the pivot pin assembly 106, and another end 116 of the spring 108 is secured, such as by insertion in a groove 118, to the cover return half 102.

A sufficient length of nylon rope or cord 119, shown in FIGS. 2 and 3, is wrapped around the assembled cover return unit 100, with one end attached to the unit itself such as by a cable clamp (not shown) secured by one of the screws (not shown) extending through holes 120. The other end of the rope 119 extends through a hole in an end cap secured on the back end of the tarp axle 32 such as by screws 122. The rope 119 is preferably knotted at this end to prevent it from being withdrawn through the hole in the end cap of the reel. As the tarp reel 32 rolls toward the passenger side 34 of the trailer, i.e. uncovering the trailer, the rope 119 unspools from the cover return unit 100. As the rope unspools, it rotates the unit 100 to wind the spring 108 and store rotational torque. When the tarp 12 is returned to the driver's side 41 of the trailer, the cover return unit 100 pulls on the back of the axle 32 using the torque stored in the spring 108.

It should be understood that while the forms of the invention shown and described above constitute preferred embodiments of the invention, they are not intended to illustrate all possible forms thereof. The words used are words of description rather than limitation, and various changes may be made without departing from the spirit and scope of the invention disclosed.

What is claimed is:

1. A unit for returning a cover of a trailer, the unit comprising:
   a spring having first and second ends, the first end of the spring being connected to the trailer;
   a cord having first and second ends, the first end of the cord being connectable to the second end of the spring, and the second end of the cord being connected to the cover; and
   a housing within which the spring is at least partially situated.

2. The cover return unit of claim 1 further comprising a pivot pin connected to the trailer, the first end of the spring being connected to the pivot pin.

3. The cover return unit of claim 2 wherein the pivot pin includes a groove adapted to receive the first end of the spring.

4. The cover return unit of claim 1 wherein the spring is a coil spring.

5. The cover return unit of claim 1 wherein the housing is adapted to receive the cord there around.

6. The cover return unit of claim 1 wherein the housing includes a groove adapted to receive the second end of the spring.

7. The apparatus of claim 1 wherein the housing is adapted to receive the cord there around.

8. The apparatus of claim 1 wherein the housing includes a groove adapted to receive the second end of the spring.

9. Apparatus for covering a trailer, the apparatus comprising:
   a cover;
   a spring having first and second ends, the first end of the spring being connected to the trailer;
   a cord having first and second ends, the first end of the cord being connectable to the second end of the spring, and the second end of the cord being connected to the cover; and
   a housing within which the spring is at least partially situated.

10. The apparatus of claim 9 further comprising a pivot pin connected to the trailer, the first end of the spring being connected to the pivot pin.

11. The apparatus of claim 10 wherein the pivot pin includes a groove adapted to receive the first end of the spring.

12. The apparatus of claim 9 wherein the spring is a coil spring.

13. A trailer comprising:
   cover;
   pivot pin connected to the trailer;
   spring having first and second ends, the first end of the spring being connected to the pivot pin;
   a cord having first and second ends, the first end of the cord being connectable to the second end of the spring, and the second end of the cord being connected to the cover; and
   a housing within which the spring is at least partially situated.

14. The trailer of claim 13 wherein the pivot pin includes a groove to receive the first end of the spring.

15. The trailer of claim 13 wherein the spring is a coil spring.

16. The trailer of claim 13 wherein the housing is adapted to receive the cord there around.

17. The trailer of claim 16 wherein the housing includes a groove adapted to receive the second end of the spring.

* * * * *